United States Patent
Lee

(10) Patent No.: US 9,800,256 B2
(45) Date of Patent: Oct. 24, 2017

(54) SEMICONDUCTOR DEVICE INCLUDING INTEGRATOR AND SUCCESSIVE APPROXIMATION REGISTER ANALOG-TO-DIGITAL CONVERTER AND DRIVING METHOD OF THE SAME

(71) Applicant: SAMSUNG ELECTRONICS CO., LTD., Suwon-si, Gyeonggi-do (KR)

(72) Inventor: Choong-Hoon Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/215,046

(22) Filed: Jul. 20, 2016

(65) Prior Publication Data
US 2017/0026053 A1 Jan. 26, 2017

(30) Foreign Application Priority Data

Jul. 20, 2015 (KR) .................. 10-2015-0102241

(51) Int. Cl.
*H03M 1/12* (2006.01)
*H03M 1/46* (2006.01)

(52) U.S. Cl.
CPC ......... *H03M 1/1245* (2013.01); *H03M 1/466* (2013.01)

(58) Field of Classification Search
CPC ........ H03M 1/468; H03M 1/164; H03M 1/46; H03M 1/12; H03M 1/804; H03M 1/144; H03M 1/806; H03M 1/403; H03M 1/466; H03M 1/442

USPC .................................. 341/150, 155, 172
See application file for complete search history.

(56) References Cited

U.S. PATENT DOCUMENTS

| | | | | |
|---|---|---|---|---|
| 5,841,310 A * | 11/1998 | Kalthoff | ............... | G06G 7/1865 |
| | | | | 327/337 |
| 6,195,032 B1 | 2/2001 | Watson et al. | | |
| 6,977,604 B2 | 12/2005 | Wada et al. | | |
| 7,230,561 B2 * | 6/2007 | Lee | ............ | G06J 1/00 |
| | | | | 341/144 |
| 7,436,341 B2 * | 10/2008 | Hsiao | .................... | H03M 1/806 |
| | | | | 341/144 |
| 7,511,648 B2 | 3/2009 | Trifonov et al. | | |

(Continued)

FOREIGN PATENT DOCUMENTS

| JP | 2013-526179 A | 6/2013 |
|---|---|---|
| JP | 2014-513496 A | 5/2014 |

(Continued)

*Primary Examiner* — Linh Nguyen
(74) *Attorney, Agent, or Firm* — Volentine & Whitt, PLLC

(57) ABSTRACT

A semiconductor device includes an integrator, a successive approximation register analog-to-digital converter (SAR ADC) and a residue capacitor. The integrator is configured to receive a signal and generate a first analog signal during a first operation mode using a capacitor module comprising one or more capacitors. The SAR ADC is configured to receive the first analog signal, convert the first analog signal into a first digital signal using the capacitor module, and generate a first residue signal in a second operation mode. The residue capacitor is connected to the capacitor module in parallel, and is configured to receive the first residue signal in the second operation mode and provide the first residue signal to the integrator in the first operation mode.

19 Claims, 15 Drawing Sheets

(56) References Cited

U.S. PATENT DOCUMENTS

| | | | |
|---|---|---|---|
| 7,616,146 B2* | 11/2009 | Sakakibara | H03M 1/0658 |
| | | | 341/155 |
| 7,629,917 B2* | 12/2009 | Shinohara | H03M 1/002 |
| | | | 341/118 |
| 7,948,410 B2 | 5/2011 | Venkataraman et al. | |
| 7,978,117 B2 | 7/2011 | Jeon et al. | |
| 8,031,094 B2 | 10/2011 | Hotelling et al. | |
| 8,102,292 B1 | 1/2012 | Van Ess | |
| 8,223,044 B2 | 7/2012 | Snedeker | |
| 8,232,905 B2 | 7/2012 | Steensgaard-Madsen | |
| 8,427,355 B2 | 4/2013 | Sin et al. | |
| 8,581,770 B2 | 11/2013 | Wang et al. | |
| 8,643,529 B2 | 2/2014 | Lin | |
| 8,836,567 B2 | 9/2014 | Lin | |
| 8,970,227 B2* | 3/2015 | Nys | H03M 1/123 |
| | | | 178/18.06 |
| 9,425,818 B1* | 8/2016 | Rajaee | H03M 3/32 |
| 2003/0210166 A1* | 11/2003 | Liu | H03M 3/34 |
| | | | 341/172 |
| 2007/0035432 A1* | 2/2007 | Gulati | H03M 1/168 |
| | | | 341/155 |
| 2009/0195423 A1* | 8/2009 | Li | H03M 3/474 |
| | | | 341/110 |
| 2011/0115661 A1* | 5/2011 | Steensgaard-Madsen | H03M 1/162 |
| | | | 341/155 |
| 2014/0340248 A1 | 11/2014 | Trampitsch | |

FOREIGN PATENT DOCUMENTS

| | | |
|---|---|---|
| KR | 0696945 | 3/2007 |
| KR | 1435978 | 8/2014 |
| WO | WO 2011-133193 A1 | 10/2011 |
| WO | WO 2012-151491 A2 | 11/2012 |

* cited by examiner

1200

1300

1400 though the exemplary embodiments of the present disclosure have been described herein with reference to the accompanying drawings, it is to be understood that the present disclosure should not be limited to those precise embodiments and that various other changes and modifications may be affected therein by one of ordinary skill in the related art without departing from the scope or spirit of the disclosure. All such changes and modifications are intended to be included within the scope of the disclosure as defined in the appended claims.

SEMICONDUCTOR DEVICE INCLUDING INTEGRATOR AND SUCCESSIVE APPROXIMATION REGISTER ANALOG-TO-DIGITAL CONVERTER AND DRIVING METHOD OF THE SAME

BACKGROUND

A claim of priority under 35 U.S.C. §119 is made to Korean Patent Application No. 10-2015-0102241 filed on Jul. 20, 2015 in the Korean Intellectual Property Office, the contents of which are hereby incorporated by reference.

The present inventive concept herein relates to a semiconductor device, and more specifically to a semiconductor device including an integrator and a successive approximation register analog-to-digital converter (SAR ADC).

Analog-to-digital converters (ADCs) may typically be used to generate sequences of digital codes each representing a signal level of an analog signal. Recently, successive approximation schemes have been used that determine bits of digital codes by iterating digital-analog conversion and comparing data items.

SUMMARY

Embodiments of the inventive concept provide a semiconductor device including a successive approximation register analog-to-digital converter (SAR ADC) that shares a capacitor module with an integrator.

Embodiments of the inventive concept provide a semiconductor device. The semiconductor device may include an integrator configured to receive a signal and generate a first analog signal responsive to the received signal in a first operation mode using a capacitor module including one or more capacitors; a successive approximation register analog-to-digital converter (SAR ADC) configured to receive the first analog signal, convert the first analog signal into a first digital signal using the capacitor module, and generate a first residue signal in a second operation mode; and a residue capacitor connected to the capacitor module in parallel. The residue capacitor is configured to receive the first residue signal in the second operation mode and provide the first residue signal to the integrator in the first operation mode.

Embodiments of the inventive concept also provide a semiconductor device. The semiconductor device may include an integrator configured to receive a signal and generate a first analog signal responsive to the received signal in a first operation mode using a capacitor module including one or more capacitors; and a successive approximation register analog-to-digital converter (SAR ADC) configured to receive the first analog signal, convert the first analog signal into a first digital signal using the capacitor module, and generate a residue signal in a second operation mode. The SAR ADC includes a controller configured to control a residue capacitor so that the residue capacitor receives the residue signal from the SAR ADC in the second operation mode and provides the residue signal to the integrator in the first operation mode.

It should be understood that objects of the present disclosure are not to be limited by the above-described embodiments, and other objects of the present disclosure will be apparent to those skilled in the art from the following descriptions.

BRIEF DESCRIPTION OF THE DRAWINGS

The above and other aspects and features of the inventive concepts will become more apparent and understood from the following detailed description taken in conjunction with the accompanying figures, wherein like reference numerals refer to like parts throughout the various figures unless otherwise specified, and wherein.

DETAILED DESCRIPTION OF THE EMBODIMENTS

Figure 1:
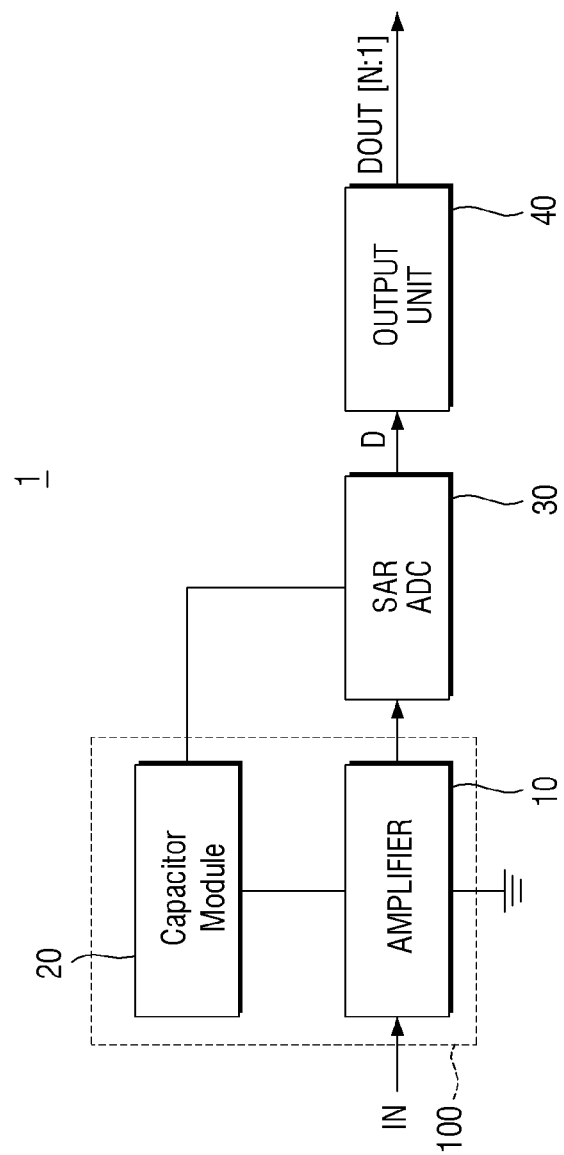
FIG. 1 illustrates a block diagram of a semiconductor device according to an embodiment of the inventive concept.

Advantages and features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the inventive concept to those skilled in the art, and the inventive concept should only be defined by the appended claims. In the drawings, the thickness of layers and regions are exaggerated for clarity.

It should be understood that when an element or layer is referred to as being "on" or "connected to" another element or layer, it can be directly on or connected to the other element or layer, or intervening elements or layers may be present. In contrast, when an element is referred to as being "directly on" or "directly connected to" another element or layer, there are no intervening elements or layers present. Other words used to describe the relationship between elements should be interpreted in a like fashion (e.g., "between" versus "directly between," "adjacent" versus "directly adjacent," etc.). Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It should be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concept.

The inventive concept may be described with reference to perspective views, cross-sectional views, and/or plan views, in which embodiments of the inventive concept are shown. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Figure 2:
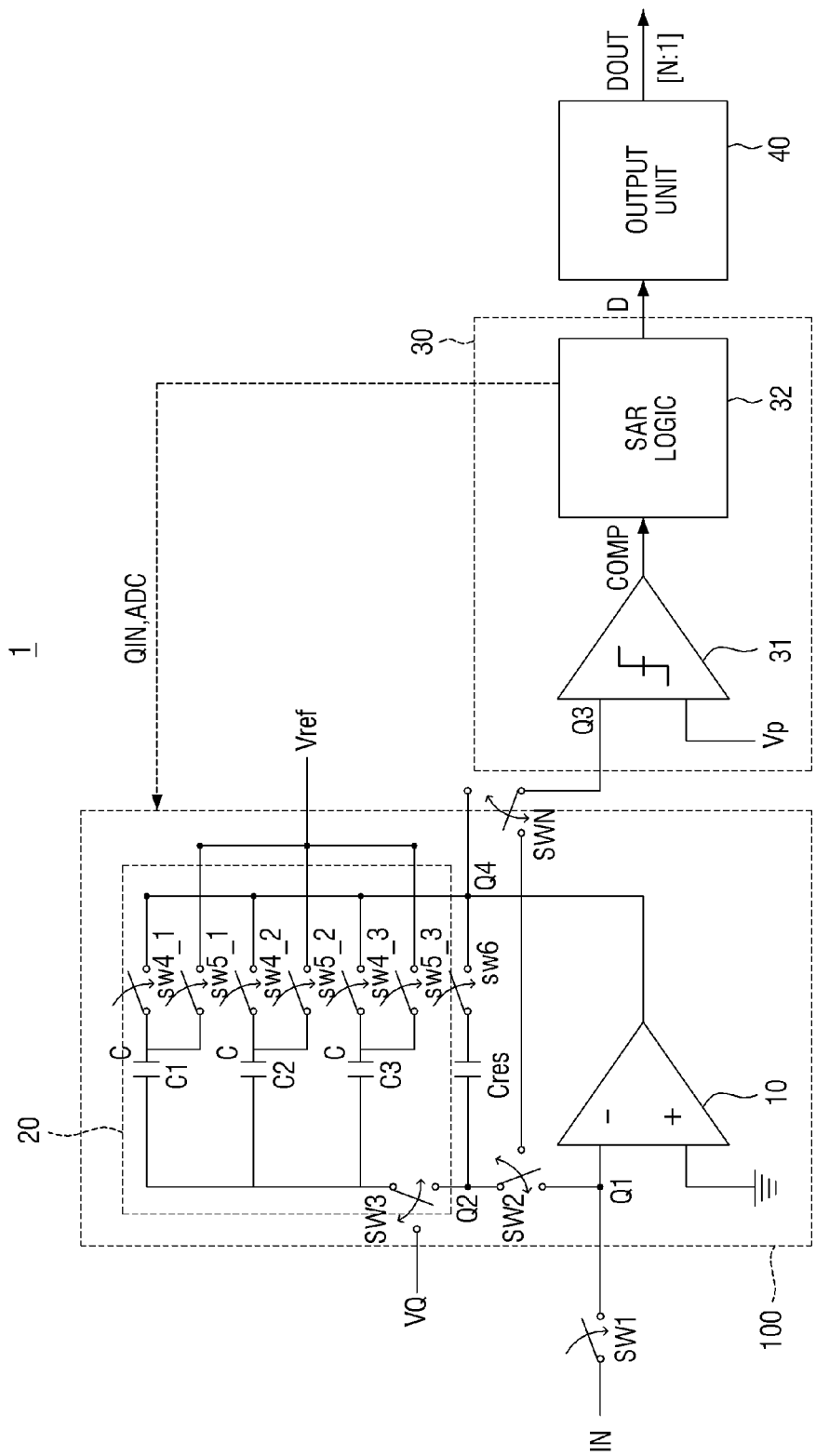
FIG. 2 illustrates a block diagram of the semiconductor device of FIG. 1 in greater detail.

FIG. 1 illustrates a block diagram of a semiconductor device according to an embodiment of the inventive concept. FIG. 2 illustrates a block diagram of the semiconductor device shown in FIG. 1 in greater detail.

Referring to FIGS. 1 and 2, a semiconductor device 1 according to an embodiment of the inventive concept includes an integrator 100, a successive approximation register analog-to-digital converter (SAR ADC) 30, and an output unit 40. The integrator 100 includes an amplifier 10 and a capacitor module 20. The SAR ADC 30 includes a comparator 31 and SAR logic 32.

The integrator 100 as shown in FIG. 2 is a current integrator and receives an input signal IN from an external component. That is, when a first switch SW1 is closed and an input signal IN is applied to the first switch SW1, the integrator 100 integrates the current of the input signal IN present at an input terminal Q1 of integrator 100 for a predetermined time period to generate an output signal. The amplifier 10 receives the input signal IN and provides an output signal to an output terminal Q4. In some embodiments, the amplifier 10 may include, but is not limited to, an operational amplifier. In the following description, the amplifier 10 is an operational amplifier having two input terminals and an output terminal.

The capacitor module 20 is shared by the amplifier 10 and the SAR ADC 30, and is connected to the amplifier 10 at timings that are different than when it is connected to the SAR ADC 30. In other words, the capacitor module 20 is shared by the amplifier 10 and the SAR ADC 30.

As will be described subsequently in further detail, when the capacitor module 20 is connected to the amplifier 10, the capacitor module 20 functions as a capacitor module for the integrator 100, such that capacitors C1, C2 and C3 of the capacitor module 20 are charged by the input current which may be subsequently applied to the output terminal Q4 of the amplifier 10.

On the other hand, when the capacitor module 20 is connected to the SAR ADC 30, the capacitor module 20 functions as a digital-to-analog converter (DAC) to provide a comparison analog signal to the SAR ADC 30. That is, when functioning as a DAC, the capacitor module 20 opens switches SW5_1 to SW5_3 therein to provide an input signal to a comparator 31 of the SAR ADC 30. The operations of the capacitor module 20 and the SAR ADC 30 will be described in more detail below.

In some applications it may be desired to perform current integration over an extended integration time period. In such applications, in order to increase the integration time period of an integrator, the capacitance of capacitors connected to the integrator must be increased. In general, in order to increase the capacitance of capacitors formed in an integrated circuit, the area occupied by the capacitors are increased. Accordingly, a capacitor module of an integrator that can achieve long integration time period necessarily occupies a large area.

In addition, in order to achieve high resolution in an SAR ADC circuit, a large number of capacitors may be required. Accordingly, the area occupied by the capacitors in such an SAR ADC circuit capable of high resolution may be significant.

However, in the semiconductor device 1 according to embodiments of the inventive concept, the integrator 100 and the SAR ADC 30 share the capacitor module 20. Accordingly, in embodiments of the inventive concept, it is possible to reduce the area of semiconductor device 1 compared to semiconductor devices in which integrators and SAR ADC circuits each have their own respective dedicated capacitor modules. By reducing circuit area, semiconductor devices according to embodiments of the inventive concept can be built with reduced manufacturing cost and simplified manufacturing processing. In addition, the power consumption of such semiconductor devices according to embodiments of the inventive concept may be reduced.

The capacitor module 20 as shown in FIG. 2 includes first to third capacitors C1 to C3 each having a capacitance value C, and a plurality of switches SW3, SW4_1 to SW4_3, and SW5_1 to SW5_3 for controlling connections of the capacitors. Capacitor module 20 however should not be limited to the configuration as shown in FIG. 2, and in other embodiments may include more capacitors in addition to capacitors C1, C2 and C3 and more switches in addition to switches SW4_1 to SW4_3 and SW5_1 to SW5_3, to increase overall capacitance and consequently increase the integration time period of the integrator 100. Additionally, as capacitor module 20 is also shared by SAR ADC 30 according to embodiments of the inventive concept, the increased number of capacitors would consequently increase the resolution of a converted digital signal output by SAR ADC 30 during analog-to-digital conversion.

In a first operation mode OP1, first terminals of the first to third capacitors C1 to C3 of capacitor module 20 are connected to the input terminal Q1 and second terminals of first to third capacitors C1 to C3 are connected via respective fourth switches SW4_1 to SW4_3 to the output terminal Q4 of the amplifier 10, to form a feedback path of amplifier 10. In the first operation mode OP1, first to third capacitors C1 to C3 accumulate charges when the integrator 100 is operated.

In a second operation mode OP2, the first terminals of first to third capacitors C1 to C3 of capacitor module 20 are connected to the input terminal Q1 and the second terminals of first to third capacitors C1 to C3 are connected via respective fifth switches SW5_1 to SW5_3 to a reference voltage Vref. In the second operation mode OP2, first to third capacitors C1 to C3 are used by the SAR ADC 30 for analog-to-digital conversion of the input signal IN.

The first to third capacitors C1 to C3 as shown in FIG. 2 are connected in parallel to each other, and have the same capacitance C.

The switches SW4_1 to SW4_3 and SW5_1 to SW5_3 respectively connected to the plurality of capacitors C1 to C3 are configured such that the plurality of capacitors C1 to C3 may be selectively connected to either the comparator 31 or the reference voltage Vref. For example, the switches SW4_1 to SW4_3 and SW5_1 to SW5_3 may be implemented as a multiplexer.

The SAR ADC 30 converts an analog signal into a digital signal according to a successive approximation scheme. Specifically, the SAR ADC 30 receives a first analog signal, determines bits of a k-bit digital signal D1 according to the successive approximation scheme, and outputs the determined bits, where k is a natural number, for example.

Integrator 100 as shown in FIG. 2 further includes a residue capacitor Cres that includes a first terminal that may be connected to the input terminal Q1 and a second terminal that may be connected to the output terminal Q4 of the amplifier 10 via switch SW6, to form a feedback path. Residue capacitor Cres may thus be connected to the capacitor module 20 in parallel. During an analog-to-digital conversion process, the residue capacitor Cres may receive a residue signal RES generated by amplifier 10, and may hold the residue signal RES. The operation of the residue capacitor Cres will be described in detail below.

The output unit 40 combines digital signals D output from the SAR ADC 30, and generates an N-bit output signal DOUT, where N is a natural number, for example. In some embodiments of the inventive concept, the SAR ADC 30 may be operated twice so as to perform the analog-to-digital conversion twice on a single input signal IN. In this case, two digital signals D1 and D2 thus generated may be combined to generate an output signal DOUT. However, the number of times the SAR ADC 30 performs the analog-to-digital conversion is not limited to two. It should be understood that the SAR ADC 30 may perform the analog-to-digital conversion k times on an input analog signal, and may combine the k digital signals thus generated.

The output unit 40 may include, but is not limited to including, digital error correction logic (DCL). The DCL may correct an error occurring during an analog-to-digital conversion process and then output an output signal DOUT. The method of correcting an error by the DCL is well known in the art and therefore is not described herein.

Figure 7:
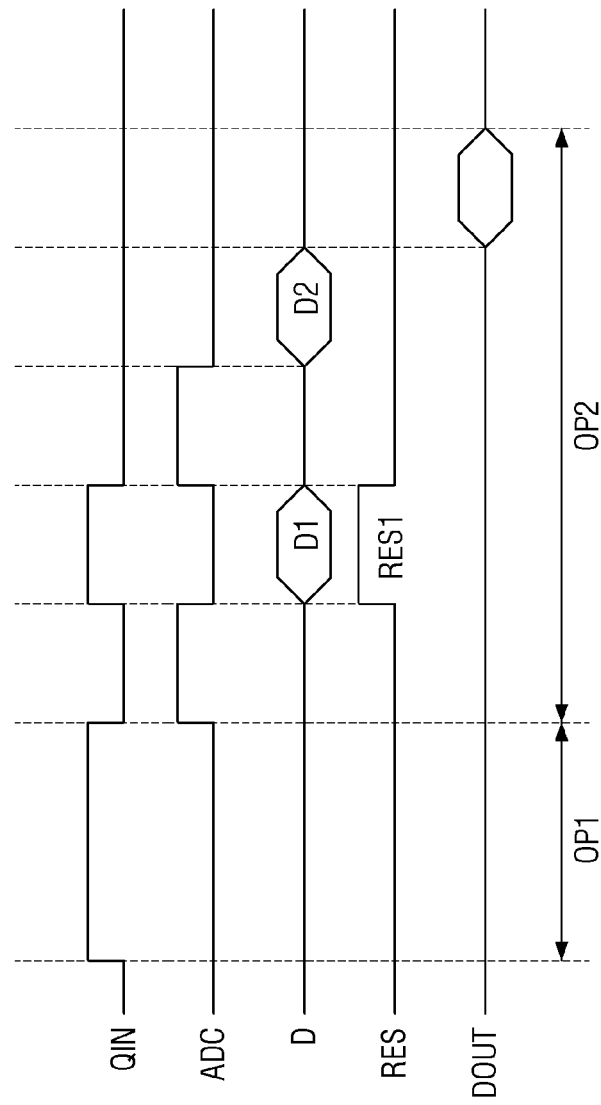
FIG. 7 illustrates a timing chart of an operation of a semiconductor device according to an embodiment of the inventive concept.
Figure 8:
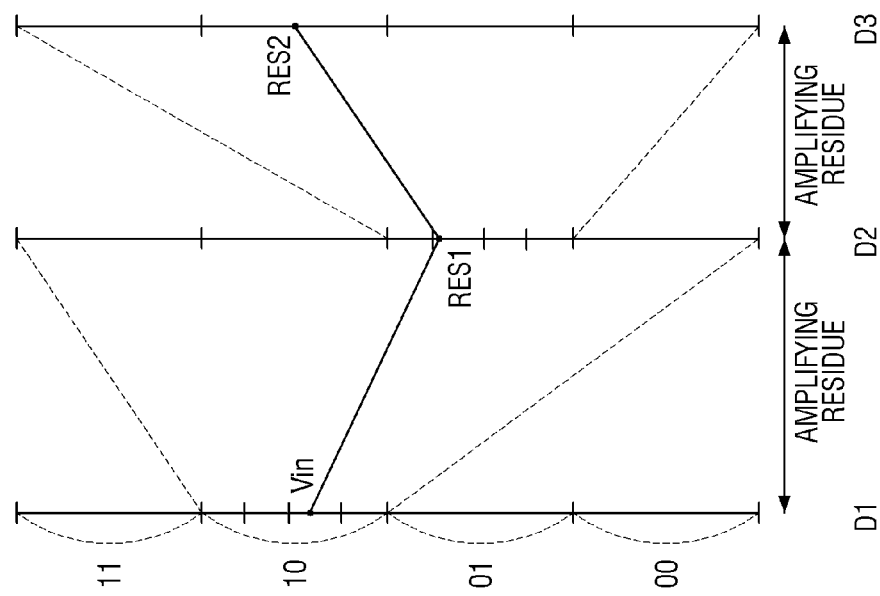
FIG. 8 illustrates another timing chart of an operation of a semiconductor device according to an embodiment of the inventive concept.

FIGS. 3 to 6 illustrate block diagrams of operation of a semiconductor device according to an embodiment of the inventive concept. FIGS. 7 and 8 illustrate timing charts of operation of a semiconductor device according to an embodiment of the inventive concept.

Figure 3:
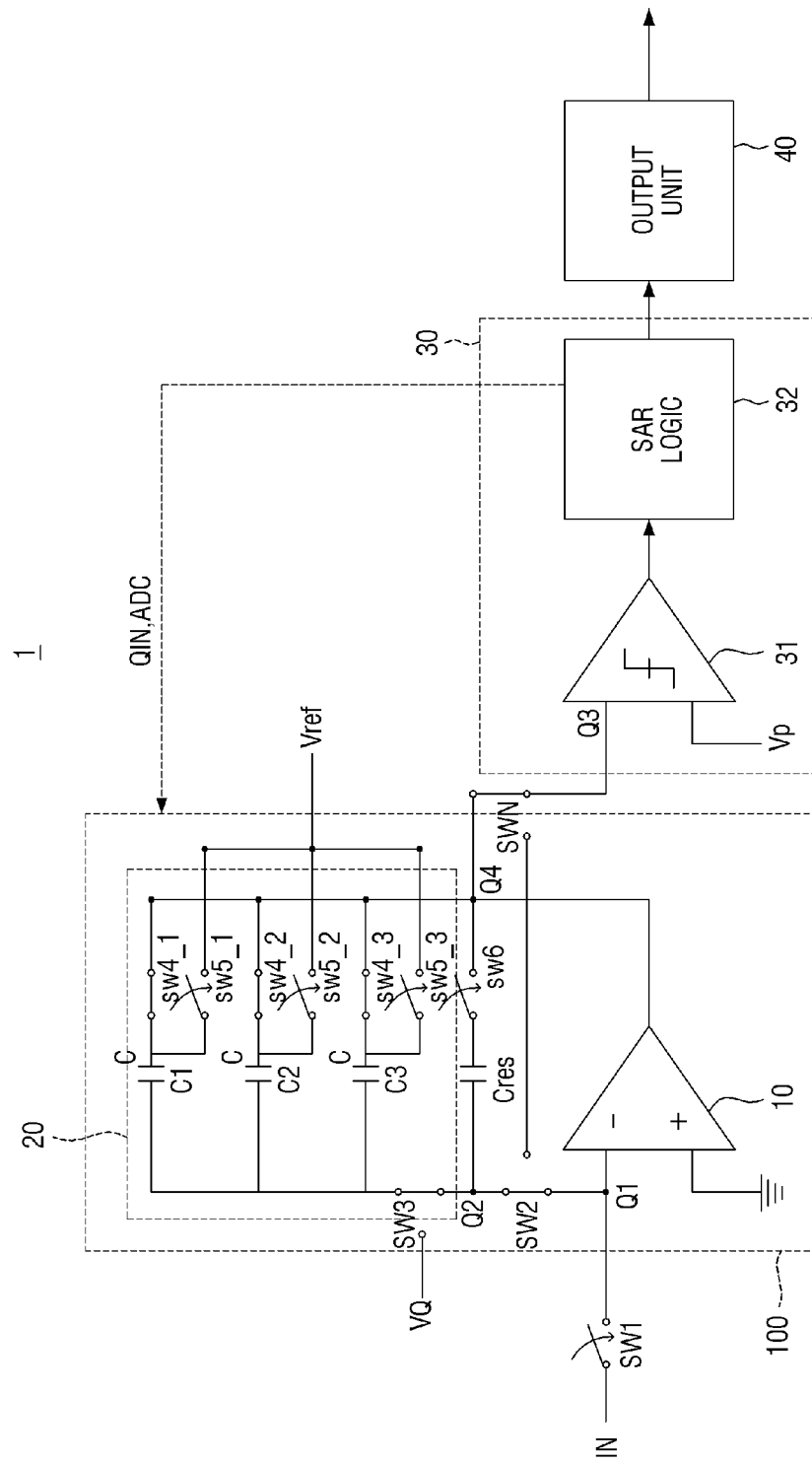
FIG. 3 illustrates a block diagram of an operation of a semiconductor device according to an embodiment of the inventive concept.

Referring to FIGS. 3 and 7, in the first operation mode OP1, an integration signal QIN is applied by the SAR logic 32 such that the integrator 100 may initiate an integration operation of an input signal IN. That is, the integration signal QIN is provided to a controller (not shown) which is connected to the switches SW4_1 to SW4_3 and SW5_1 to SW5_3, and the controller (not shown) may initiate the integration operation of an input signal IN by opening/closing the switches SW4_1 to SW4_3 and SW5_1 to SW5_3.

In embodiments of the inventive concept, the capacitor module 20 may be used by the integrator 100. That is, the first switch SW1 may be closed, such that an input signal IN may be provided to the integrator 100. The integrator 100 may use the capacitor module 20 to integrate the current of the input signal IN to generate a first analog signal. Then, the integrator 100 may provide the first analog signal to the output terminal Q4 of the amplifier 10.

The first analog signal may be stored in an energy storage element temporarily, and may be provided to the comparator 31 during an analog-to-digital conversion process to be performed later in the second operation mode OP2. The energy storage element in which the first analog signal is stored temporarily may be an additional capacitor (not shown).

Referring to FIGS. 3 and 7, in the first operation mode OP1, a second switch SW2 and a third switch SW3 are connected to the input terminal Q1 and a residue node Q2, respectively, such that the capacitor module 20 is connected to the input terminal Q1 of the amplifier 10. In addition, fourth switches SW4_1 to SW4_3 are closed and fifth switches SW5_1 to SW5_3 are opened, such that the capacitor module 20 is connected to the output terminal Q4 of the amplifier 10.

Accordingly, in the first operation mode OP1, the capacitor module 20 is connected in a feedback path from the input terminal Q1 to the output terminal Q4 of the amplifier 10, to integrate the input signal IN to store it.

Figure 4:
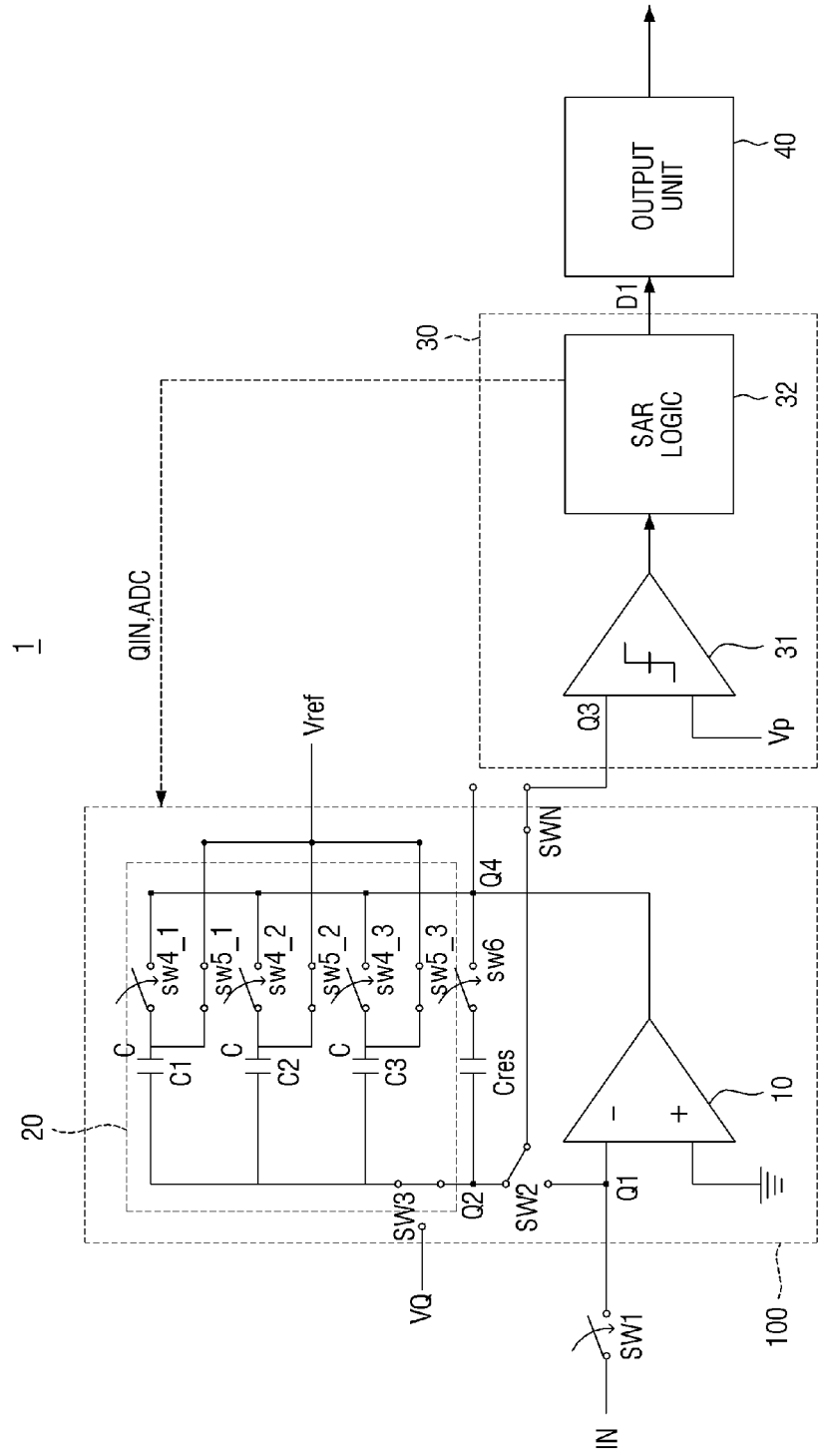
FIG. 4 illustrates a further block diagram of an operation of a semiconductor device according to an embodiment of the inventive concept.

Referring to FIGS. 4 and 7, in the second operation mode OP2, the SAR ADC 30 converts the first analog signal into a first digital signal D1.

Specifically, in the second operation mode OP2, SAR logic 32 generates a conversion signal ADC that is applied to capacitor module 20 to connect the fifth switches SW5_1 to SW5_3 to the reference voltage Vref sequentially.

The comparator 31 compares a voltage at the input terminal Q3, i.e., one of its input terminals, with a comparison voltage Vp at the other of its input terminals, and provides an output value COMP to the SAR logic 32. The comparison voltage Vp may be the first analog signal generated in the first operation mode.

The SAR logic 32 then determines digits of the first digital signal D1 depending on the output value COMP from the comparator 31, and outputs the first digital signal D1 to the output unit 40. The output unit 40 may temporarily store the received first digital signal D1, and may generate an output signal DOUT by combining it with digital signals to be generated subsequently.

Figure 5:
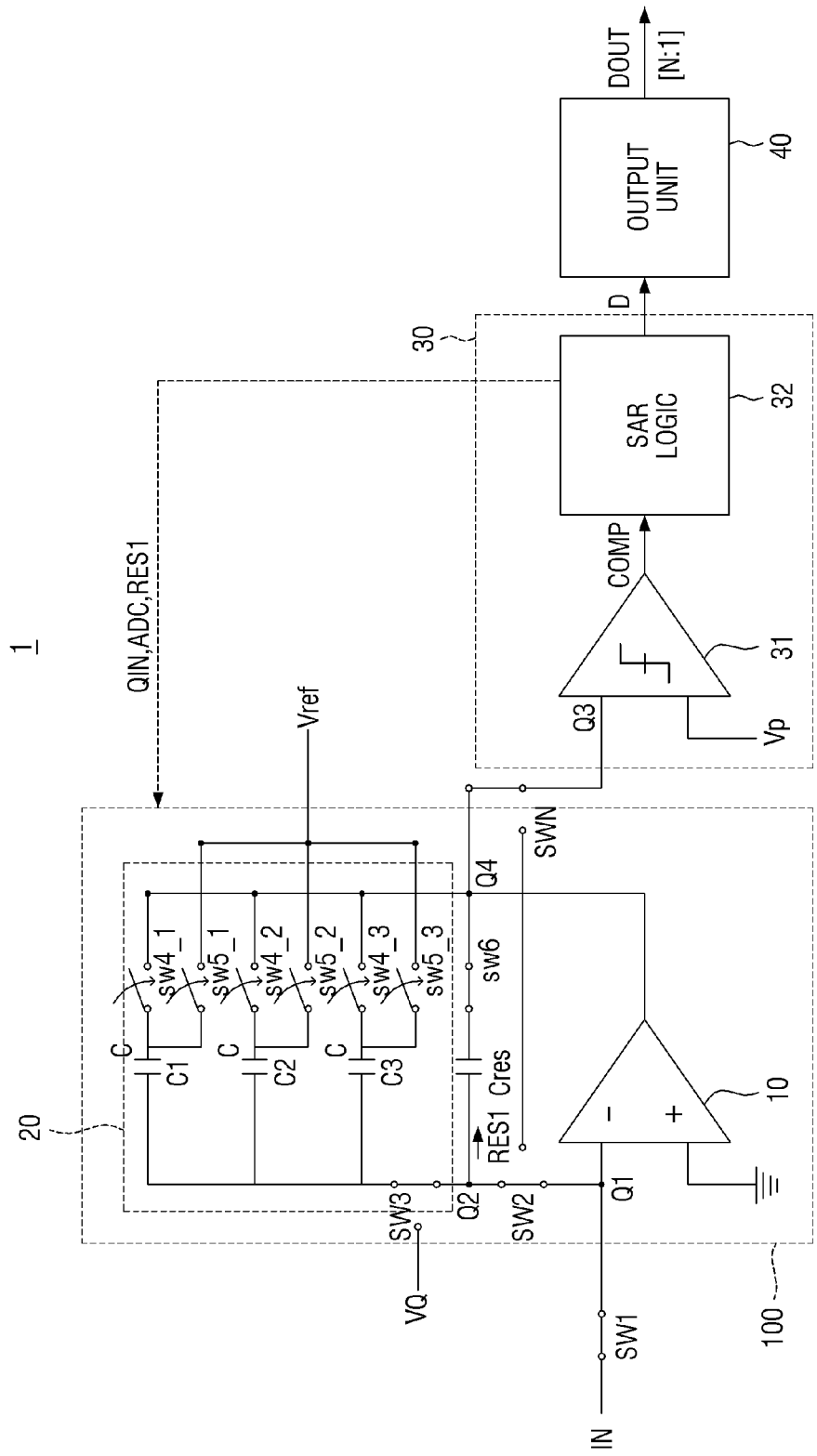
FIG. 5 illustrates a still further block diagram of an operation of a semiconductor device according to an embodiment of the inventive concept.

Referring to FIGS. 5 and 8, a first residue signal RES1 generated during the analog-to-digital conversion process is sampled and held by a residue capacitor Cres.

The first residue signal RES1 may be provided to the residue node Q2. The switches SW4_1 to SW4_3 and SW5_1 to SW5_3 are opened but the switches SW3 and SW6 are closed to charge the residue capacitor Cres by the first residue signal RES1.

Typically, in analog-to-digital conversion consisting of multiple steps such as a pipeline ADC, a most significant bit (MSB) is first determined and then a bit of the next digit is determined. In doing so, a residue signal is generated in the previous step so as to perform analog-to-digital conversion in the next step.

In the semiconductor device 1 according to embodiments of the inventive concept, it is assumed that the SAR ADC 30 has 6-bit resolution and performs three-step, analog-to-digital conversion, for example.

Referring to FIG. 8, as an example, when an input voltage Vin is applied at the input terminal Q3 of the comparator 31 of SAR ADC 30, the level of the input voltage Vin may be located at "10" level. At a first stage, analog-to-digital conversion is performed to generate the first digital signal D1 having bits of "10." Then, at a second stage, a first residue signal RES1 is sampled such that it is located at "01" level. Then, at the second stage, analog-to-digital conversion is performed on the first residue signal RES1 to generate a second digital signal D2 having bits of "01," and a second residue signal RES2 is again sampled such that it is located at "10" level. Finally, at a third stage, analog-to-digital conversion is performed on the second residue signal RES2 to generate a third digital signal D3 having bits of "10."

In the semiconductor device according an embodiment of the inventive concept, the analog-to-digital conversion with three stages may be performed by the single SAR ADC 30, rather than by three ADCs.

The first residue signal RES1 is received at the residue capacitor Cres disposed in the feedback path of the amplifier 10, and may be sampled to generate a second analog signal. The second analog signal may be sent to the comparator 31 to be compared with the comparison voltage Vp.

In the semiconductor device according to an embodiment of the inventive concept, the residue signal is generated using the residue capacitor Cres connected in the feedback path to the amplifier 10. Accordingly, no additional ADC is required to perform analog-to-digital conversion at subsequent steps. As a result, the area occupied by the semiconductor device 1 in an integrated circuit can be reduced.

Figure 6:
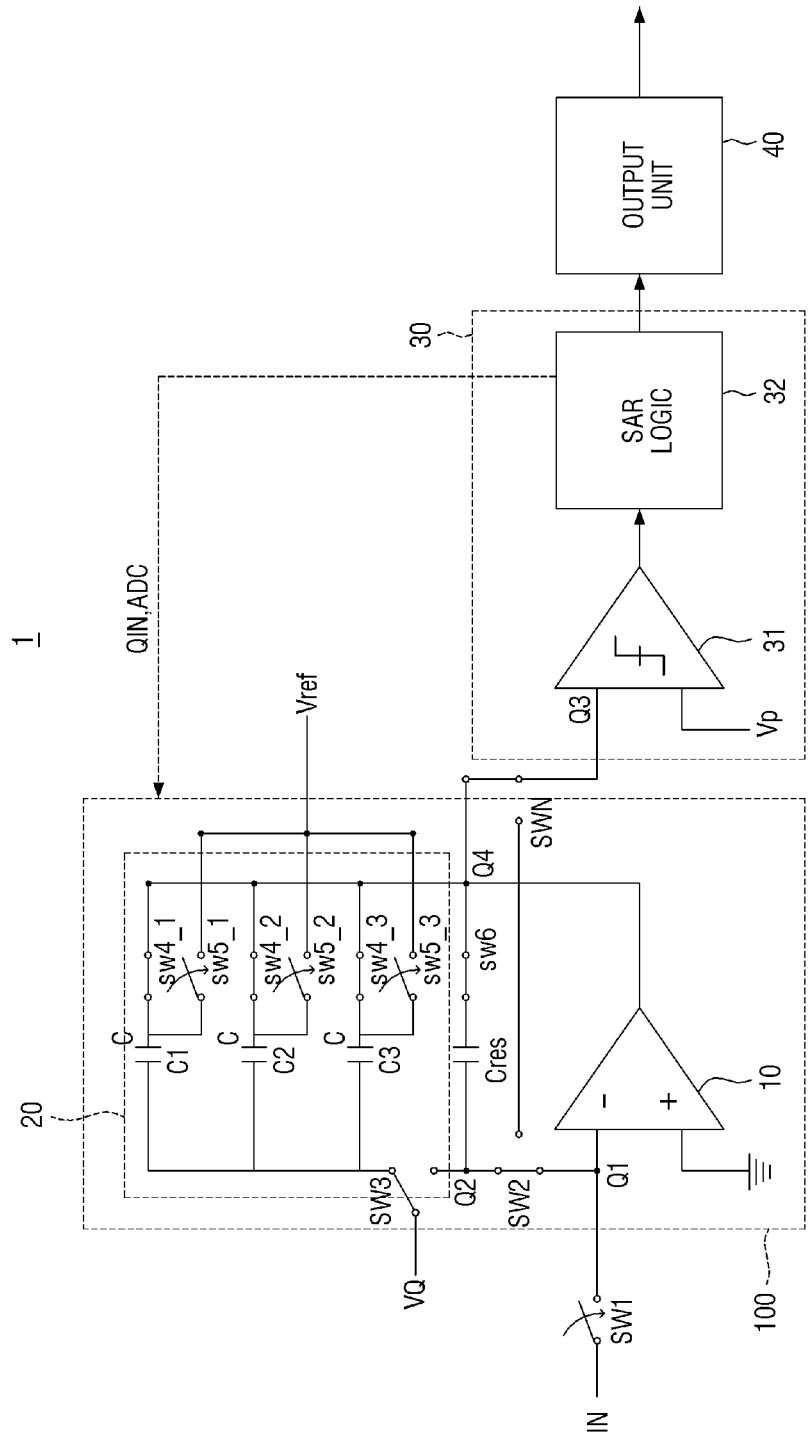
FIG. 6 illustrates yet still further block diagram of an operation of a semiconductor device according to an embodiment of the inventive concept.

Referring to FIG. 6, the first terminals of first to third capacitors C1 to C3 are connected to a charge voltage VQ via the third switch SW3, and are charged for analog-to-digital conversion at a subsequent step. In the meantime, the voltage level of the first residue signal RES1 is still maintained by the residue capacitor Cres.

Referring back to FIGS. 4 and 7, the second operation mode OP2 is initiated again, and the second analog signal generated by sampling the first residue signal RES1 in FIG. 5 is provided to the comparator 31.

In addition, the first to third capacitors C1 to C3 are connected to the reference voltage sequentially, and the analog-to-digital conversion at the subsequent step is performed, such that a second digital signal D2 may be generated.

The number of bits of the first digital signal D1 may be equal to that of the number of bits of the second digital signal D2, but this is merely illustrative. That is, different numbers of bits of digital signals may be generated in different analog-to-digital conversion processes.

The output unit 40 may combine the first digital signal D1 and the second digital signal D2, to generate an output signal DOUT. If the output unit has the functionality of a DCL, it may correct an error in the output signal DOUT.

In the semiconductor device 1 according to an embodiment of the inventive concept, the analog-to-digital conversion is performed in the three steps as described above with respect to FIG. 8. However, this is merely illustrative. For performing analog-to-digital conversion with higher resolution, the analog-to-digital conversion may be performed with more steps, to increase the number N of bits of a digital output signal.

Of note, it may be generally contemplated to increase the number of capacitors included in a capacitor module used in analog-to-digital conversion to increase resolution. However, this would increase area occupied by the capacitor module in an integrated circuit.

However, according to embodiments of the inventive concept, multi-stage analog-to-digital conversion is performed using the residue capacitor Cres connected in the feedback path and the residue signal sampled by the residue capacitor Cres. As a result, the analog-to-digital conversion can be performed in the same SAR ADC 30, thus avoiding the necessity of increasing the area occupied by the capacitor module 20, and the analog-to-digital conversion can be performed with high resolution.

In embodiments of the inventive concept, the number of the steps of the analog-to-digital conversion and the number of capacitors included in the capacitor module 20 may vary depending on design choice and the corresponding application. According to such embodiments of the inventive concept, to implement an integrated circuit having a small area, the capacitor module 20 may be designed to have a less number of capacitors, while the number of steps of the analog-to-digital conversion performed by the SAR ADC 30 may be increased.

Figure 9:
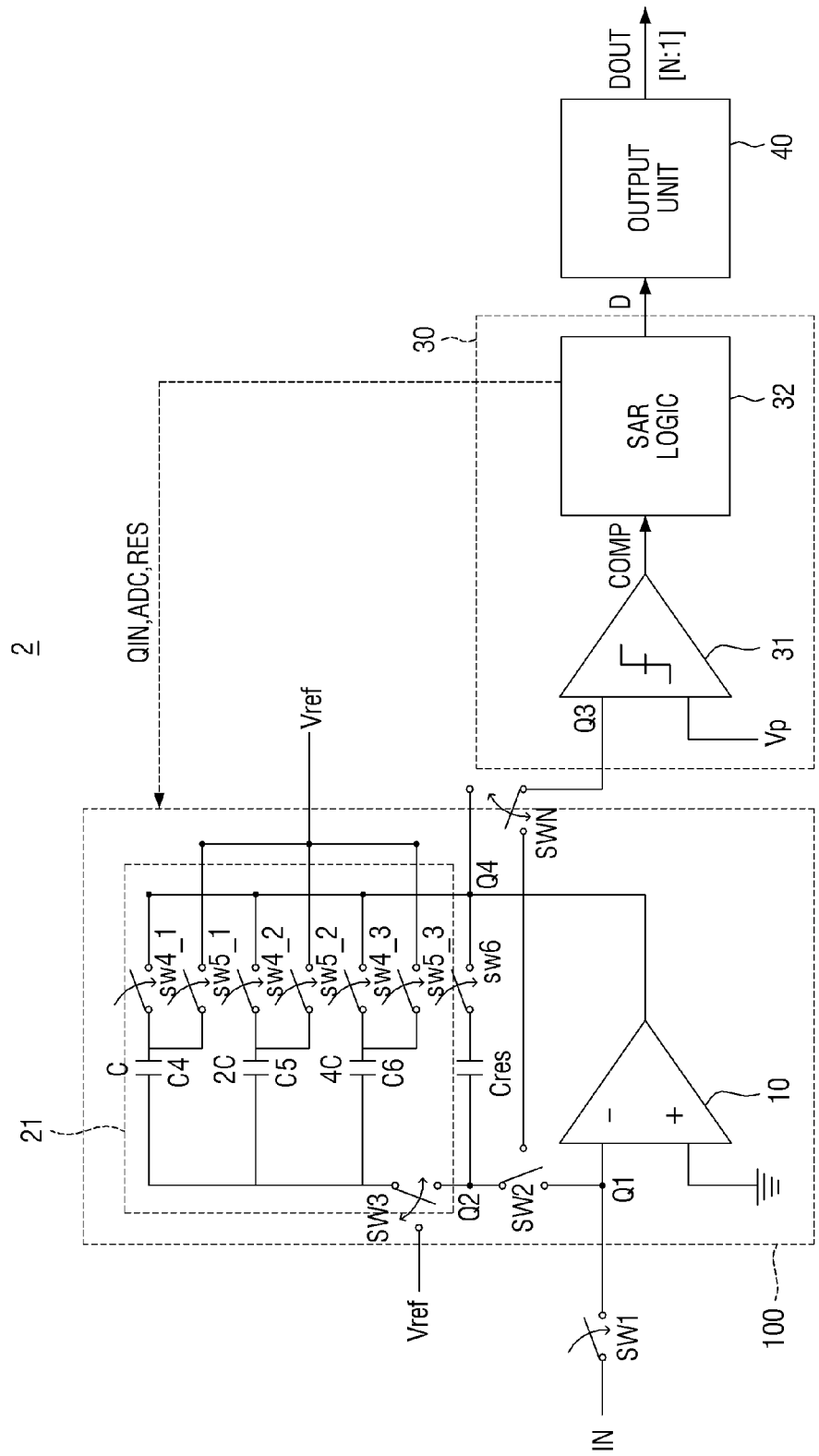
FIG. 9 illustrates a block diagram of a semiconductor device according to another embodiment of the inventive concept.

FIG. 9 illustrates a block diagram of a semiconductor device according to another embodiment of the inventive concept. In the following, description will be made focusing on differences from the embodiment described previously with respect to FIGS. 1-8, and redundant description will be omitted.

A semiconductor device 2 according to an embodiment of the inventive concept includes a capacitor module 21 that is different than the capacitor module 20. Specifically, capacitor module 21 in FIG. 9 is similar in configuration to capacitor module 20 shown in FIG. 2, except for including capacitors C4, C5 and C6 instead of capacitors C1, C2 and C3 shown in FIG. 2. Capacitor C4 has a capacitance value C, capacitor C5 has a capacitance 2C that is twice the capacitance of a capacitor C4, and capacitor C6 has a capacitance 4C that is twice the capacitance of capacitor C5. With this configuration, the capacitor module 21 may be characterized as a binary weighted capacitor array. Although the capacitor module 21 includes three capacitors in FIG. 9, the number of capacitors is not limited to three. That is, in embodiments of the inventive concept, the capacitor module 21 may include m capacitors, where m is a natural number. The capacitance of the $m^{th}$ capacitor may be $2^{m-1}$ C.

Figure 10:
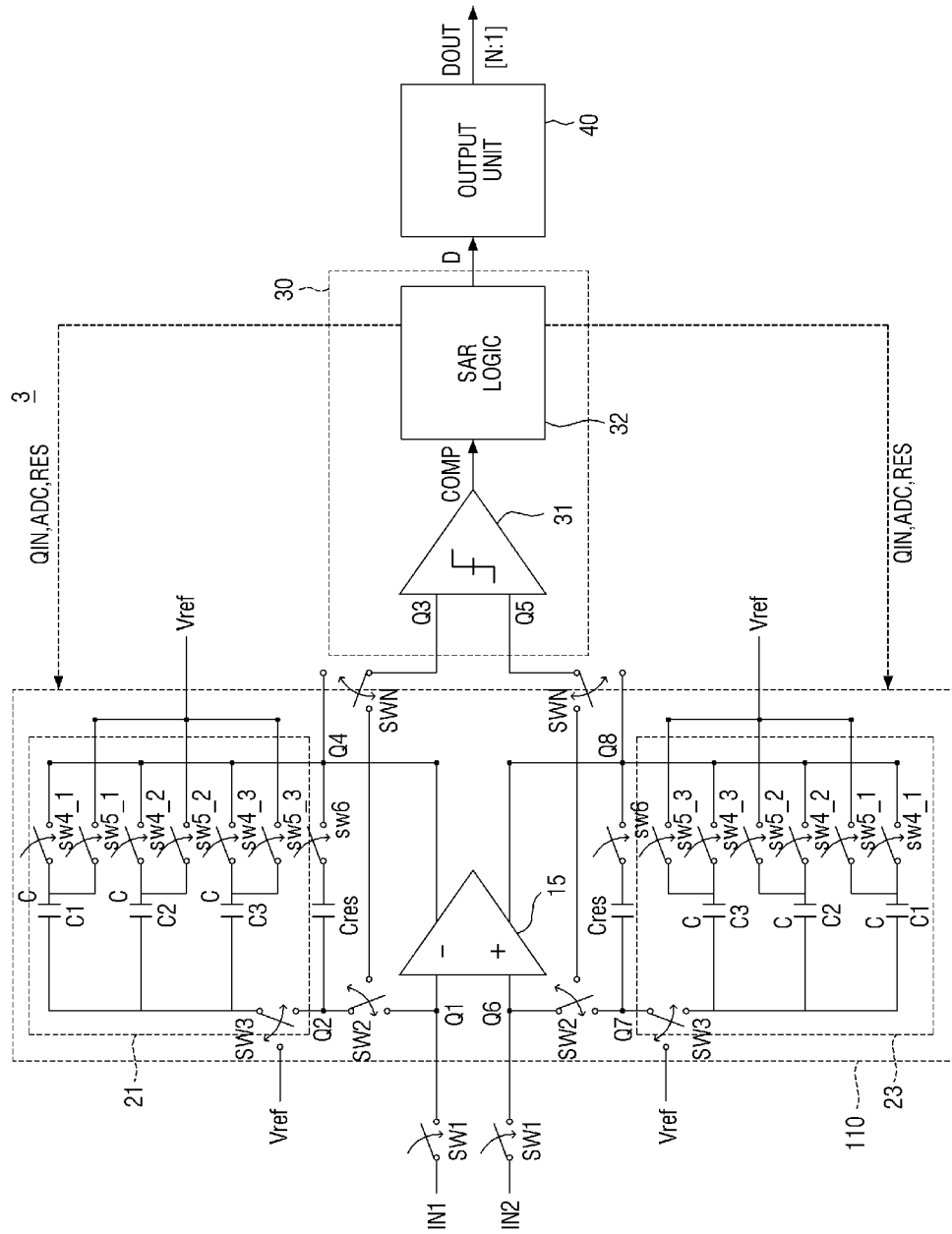
FIG. 10 illustrates a block diagram of a semiconductor device according to still another embodiment of the inventive concept.

FIG. 10 illustrates a block diagram of a semiconductor device according to still another embodiment of the inventive concept. In the following, description will be made focusing on differences from the previous embodiments described, and redundant description will be omitted.

Referring to FIG. 10, a semiconductor device 3 according to an embodiment of the inventive concept performs analog-to-digital conversion on a differential signal including input signals IN1 and IN2. That is, an integrator 110 receives differential input signals IN1 and IN2 to generate analog signals, and provides the analog signals to the SAR ADC 30. Differential input signals IN1 and IN2 may be the signals having same magnitude, but opposite phase.

Amplifier 15 is a differential amplifier that amplifies the differential input signals IN1 and IN2 provided at input terminals Q1 and Q6 via respective switches SW1, to provide respective output signals at output terminals Q4 and Q8. The operation of the differential amplifier is well known in the art; and thus is not described herein.

Capacitor module 21 as shown in FIG. 10 is configured and functions similarly as capacitor module 21 described with respect to FIGS. 2-8. Capacitor module 23 in turn is configured and functions similarly as capacitor module 21, however including residue capacitor Cres connected between residue node Q7 and output terminal Q8. Moreover, in addition to including input terminal Q3 connected to residue node Q2 via switches SWN and SW2, comparator 31 of SAR ADC 30 further includes input terminal Q5 connected to residue node Q7 via corresponding switches SWN and SW2 as further shown. The comparator 31 compares differential signal between output signal from the capacitor module 21 and output signal from the capacitor module 23 with a comparison voltage and provide an output value COMP to the SAR logic 32.

Figure 11:
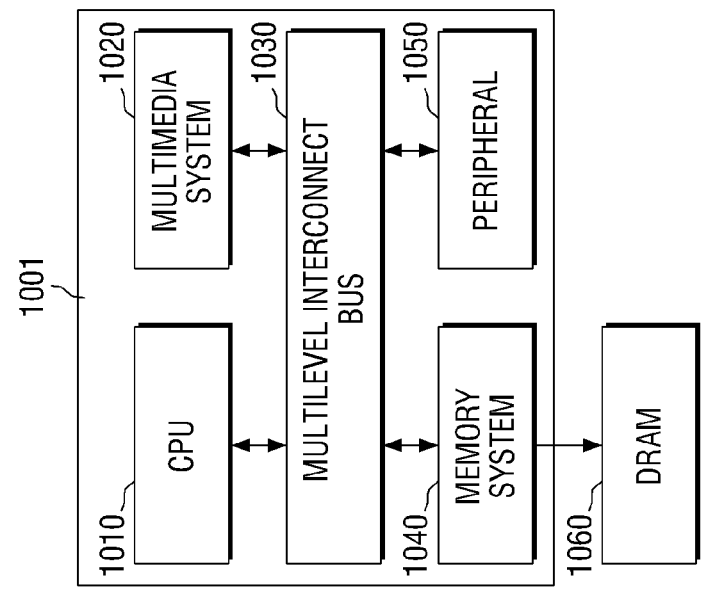
FIG. 11 illustrates a block diagram of a system-on-chip (SOC) including a semiconductor device according to an embodiment of the inventive concept.

FIG. 11 illustrates a block diagram of a system-on-chip (SoC) including a semiconductor device according to an embodiment of the inventive concept.

Referring to FIG. 11, the SoC 1000 includes an application processor 1001 and a DRAM 1060.

The application processor 1001 includes a CPU 1010, a multimedia system 1020, a multi-level interconnect bus 1030, a memory system 1040 and a peripheral circuit 1050.

The CPU 1010 may perform operations necessary for driving the SoC 1000. Although a single CPU 1010 is shown, in some embodiments of the inventive concept the CPU 1010 may be configured in a multi-core environment including multiple cores.

The multimedia system 1020 may be used in the SoC system to perform various types of multimedia functions. The multimedia system 1020 may include a 3D engine module, video codec, a display system, a camera system, a post-processor, etc.

The multi-level interconnect bus 1030 may be used for data communications among the CPU 1010, the multimedia system 1020, the memory system 1040 and the peripheral circuit 1050. In some embodiments of the inventive concept, the multi-level interconnect bus 1030 may have a multi-layer structure. Specifically, examples of the multi-level interconnect bus 1030 may include, but are not limited to, a multi-layer AHB (Advanced High-performance Bus) and a multi-layer AXI (Advanced eXtensible Interface), for example.

The memory system 1040 may provide the application processor 1001 with an environment necessary for high speed operation with an external memory (e.g., the DRAM 1060). In some embodiments of the inventive concept, the memory system 1040 may include an additional controller (e.g., a DRAM controller) for controlling an external memory (e.g., the DRAM 1060).

The peripheral 1050 may provide an environment necessary for facilitating the connection between the SoC 1000 and an external device (e.g., a main board). Accordingly, the peripheral circuit 1050 may have various interfaces that make external devices connected to the SoC 1000 compatible with the system.

The DRAM 1060 may function as an operational memory necessary for the application processor 1001 to operate. In some embodiments of the inventive concept, the DRAM 1060 may be disposed outside the application processor 1001, as shown in FIG. 11. Specifically, the DRAM 1060 may be packaged with the application processor 1001 as a package-on-package (PoP) assembly.

At least one of the elements of the SoC 1000 may employ the semiconductor device according to any one of the above-described embodiments of the inventive concept.

Figure 12:
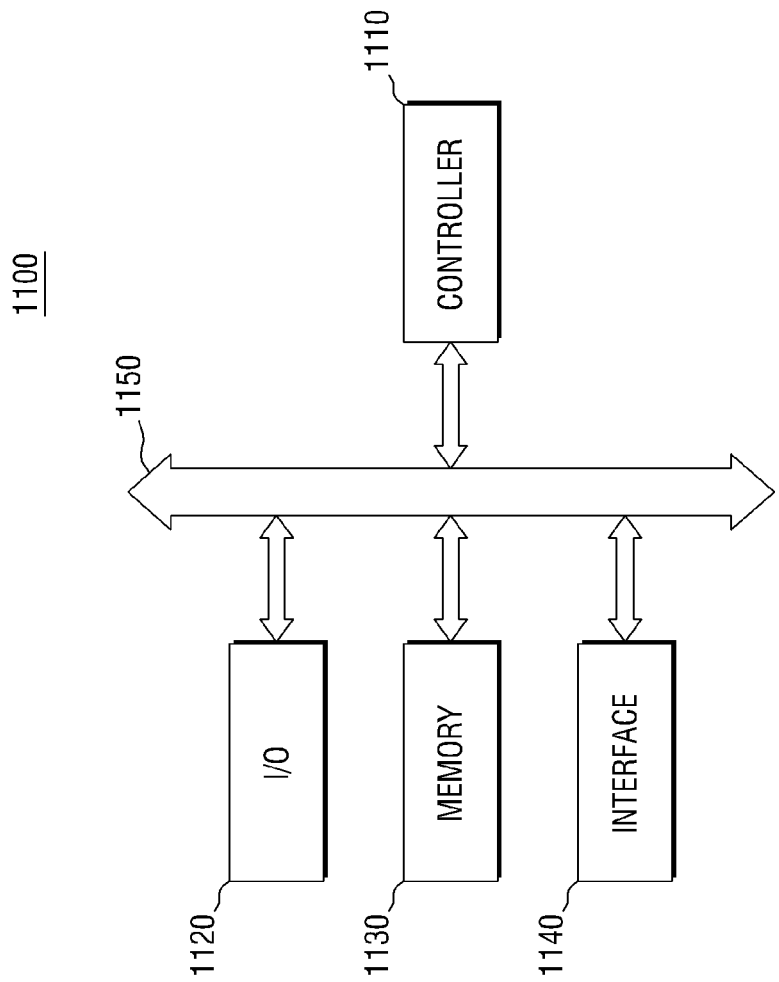
FIG. 12 illustrates a block diagram of an electronic system including a semiconductor device and an SoC according to an embodiment of the inventive concept.

FIG. 12 illustrates a block diagram of an electronic system including the semiconductor device and the SoC according to embodiments of the inventive concept.

Referring to FIG. 12, the electronic system 1100 according to an embodiment of the inventive concept includes a controller 1110, an I/O (input/output) device 1120, a memory device 1130, an interface 1140 and a bus 1150. The controller 1110, the I/O device 1120, the memory device 1130 and/or the interface 1140 are connected to one another via the bus 1150. The bus 1150 may serve as a path via which data is transferred.

The controller 1110 may include at least one of a microprocessor, a digital signal processor, a microcontroller and logic elements capable of performing similar functions. The I/O device 1120 may include a keypad, a keyboard, a display device, or the like. The memory device 1130 may store therein data and/or instructions, for example. The interface 1140 may be capable of transmitting/receiving data to/from a communication network. The interface 1140 may be either a wired or wireless interface. For example, the interface 1140 may include an antenna, a wired/wireless transceiver or the like.

Although not shown in FIG. 12, the electronic system 1100 is an operational memory for improving the operation of the controller 1110 and may further include a high-speed DRAM and/or SRAM, for example. As the operational memory, the semiconductor device according to any one of the above-described embodiments of the inventive concept may be employed, thereby improving reliability of the semiconductor device.

Additionally, the semiconductor device according to embodiments of the inventive concept may be provided in the memory device 1130 or may be provided as a part of the controller 1110 or the I/O device 1120, for example.

The electronic system 1100 may be applied to a PDA (personal digital assistant), a portable computer, a web tablet, a wireless phone, a mobile phone, a digital music player, a memory card, or any electronic device capable of transmitting/receiving information in wireless environment.

Figure 13:
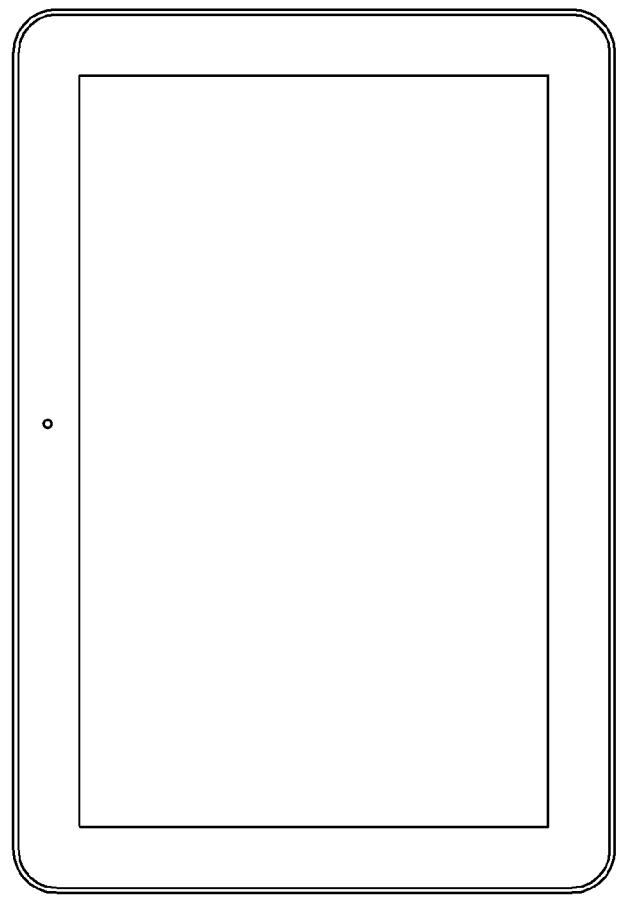
FIG. 13 illustrates an example of a semiconductor system employing a semiconductor device according to an embodiment of the inventive concept.
Figure 14:
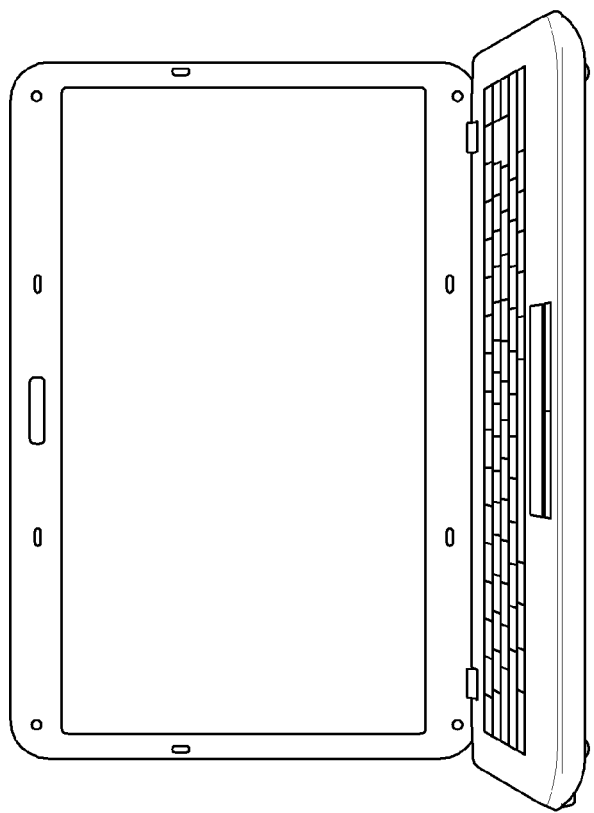
FIG. 14 illustrates an example of another semiconductor system employing a semiconductor device according to an embodiment of the inventive concept.
Figure 15:
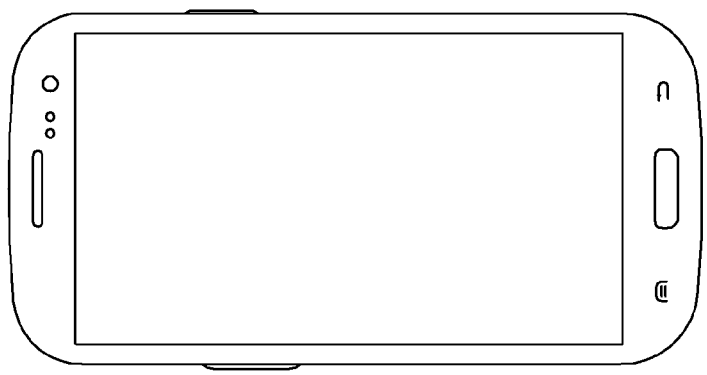
FIG. 15 illustrates an example of still another semiconductor system employing a semiconductor device according to an embodiment of the inventive concept.

FIGS. 13 to 15 illustrate examples of semiconductor systems employing the semiconductor devices according to embodiments of the inventive concept.

FIG. 13 illustrates a tablet PC 1200, FIG. 14 illustrates a laptop computer 1300, and FIG. 15 illustrates a smartphone 1400. At least one of the semiconductor devices according to embodiments of the inventive concept may be employed by the tablet PC 1200, the laptop computer 1300, the smartphone 1400.

As will be appreciated by those skilled in the art, embodiments of the inventive concept may be employed by other integrated circuit devices than those described above. That is, in the foregoing descriptions, the tablet PC 1200, the laptop computer 1300 and the smartphone 1400 have been mentioned merely as examples of semiconductor systems which may employ embodiments of the inventive concept, and are not intended to be limiting.

In some embodiments of the inventive concept, the semiconductor system may be implemented as: a computer, a UMPC (Ultra Mobile PC), a workstation, a net-book, a PDA (Personal Digital Assistants), a portable computer, a wireless phone, a mobile phone, an e-book, a PMP (portable multimedia player), a portable game console, a navigation device, a black box, a digital camera, a 3-dimensional television, a digital audio recorder, a digital audio player, a digital picture recorder, a digital picture player, a digital video recorder, a digital video player, etc.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

The embodiments of the present inventive concept have been described with reference to the attached drawings, but it should be understood by one of ordinary skill in the art that the present inventive concept may be performed by one of ordinary skill in the art in other specific forms without changing the technical concept or essential features of the present inventive concept. Further, the above-described embodiments are merely examples and should not limit the scope of the present inventive concept.

What is claimed is:

1. A semiconductor device comprising:
    an integrator configured to receive a signal and generate a first analog signal responsive to the received signal in a first operation mode using a capacitor module comprising one or more capacitors;
    a successive approximation register analog-to-digital converter (SAR ADC) configured to receive the first analog signal, and convert the first analog signal into a first digital signal using the capacitor module, resulting in generation of a first residue signal in a second operation mode; and
    a residue capacitor connected to the capacitor module in parallel, the residue capacitor configured to receive the first residue signal in the second operation mode and afterwards provide the first residue signal,
    wherein the integrator is configured to receive the first residue signal generated as a result of the SAR ADC converting the first analog signal into the first digital signal, to generate a second analog signal by sampling the first residue using a residue capacitor connected to the capacitor module in parallel, and the SAR ADC is configured to convert the second analog signal into a second digital signal.

2. The semiconductor device of claim 1, further comprising:
    an output unit configured to combine the first digital signal and the second digital signal to generate an output signal.

3. The semiconductor device of claim 1,
    wherein a number of bits of the first digital signal is different from a number of bits of the second digital signal.

4. The semiconductor device of claim 1, wherein the SAR ADC is further configured to receive the second analog signal to generate a second residue signal.

5. The semiconductor device of claim 1, further comprising:
    a switch configured to be closed such that the first residue signal is provided from the residue capacitor, and to be opened such that the first residue signal is maintained in the residue capacitor.

6. The semiconductor device of claim 1,
    wherein the one or more capacitors comprise a first capacitor and a second capacitor connected to the first capacitor in parallel.

7. The semiconductor device of claim 6,
    wherein a capacitance of the first capacitor is equal to a capacitance of the second capacitor.

8. The semiconductor device of claim 6,
    wherein a capacitance of the second capacitor is twice a capacitance of the first capacitor.

9. The semiconductor device of claim 1,
    wherein the residue capacitor is connected in a feedback path between an input terminal and an output terminal of the integrator.

10. The semiconductor device of claim 1, wherein the SAR ADC comprises:
    a comparator configured to compare the first analog signal received from the integrator with a reference voltage; and
    controller logic configured to receive an output from the comparator and to provide the first residue signal to the residue capacitor.

11. The semiconductor device of claim 10,
    wherein the capacitor module comprises one or more switches each connected to respective capacitors of the one or more capacitors, and the controller logic is configured to open the one or more switches such that the one or more capacitors are connected to the reference voltage.

12. A semiconductor device, comprising:

an integrator configured to receive a signal and generate a first analog signal responsive to the received signal in a first operation mode using a capacitor module comprising one or more capacitors; and a successive approximation register analog-to-digital converter (SAR ADC) configured to receive the first analog signal, and convert the first analog signal into a first digital signal using the capacitor module, resulting in generation of a residue signal in a second operation mode, the SAR ADC comprising a controller configured to control a residue capacitor so that the residue capacitor receives the residue signal from the SAR ADC in the second operation mode and afterwards provide the residue signal, wherein the integrator is configured to receive the residue signal generated as a result of the SAR ADC converting the first analog signal into the first digital signal, to generate a second analog signal by sampling the first residue using a residue capacitor connected to the capacitor module in parallel, and the SAR ADC is configured to convert the second analog signal into a second digital signal.

13. The semiconductor device of claim 12, wherein the capacitor module comprises one or more switches, the one or more switches being connected to respective capacitors of the one or more capacitors and being opened and closed as the first operation mode and the second operation mode change, wherein the controller is configured to control the one or more switches.

14. The semiconductor device of claim 12, wherein the residue capacitor is connected to an input terminal of the integrator via a switch, and the controller is configured to control the switch.

15. The semiconductor device of claim 12, wherein the residue capacitor is connected to the capacitor module in parallel.

16. A driving method of a semiconductor device comprising:

generating, by an integrator comprising a capacitor module, a first analog signal responsive to a received signal in a first operation mode using the capacitor module comprising a plurality of capacitors that are each individually selectively switchable to be connected and disconnected;

converting the first analog signal into a first digital signal using the capacitor module and generating a first residue signal in a second operation module; and generating a second analog signal by sampling the first residue using a residue capacitor connected to the capacitor module in parallel.

17. The driving method of claim 16, wherein the converting the first analog signal into the first digital signal comprises connecting the plurality of capacitors in the capacitor module to a reference voltage sequentially.

18. The driving method of claim 16, further comprising:

converting the second analog signal into a second digital signal.

19. The driving method of claim 18, wherein a number of bits of the first digital signal is different from a number of bits of the second digital signal.

* * * * *